(12) United States Patent
Fujimaki

(10) Patent No.: US 7,663,241 B2
(45) Date of Patent: Feb. 16, 2010

(54) SEMICONDUCTOR DEVICE

(75) Inventor: Hirokazu Fujimaki, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 41 days.

(21) Appl. No.: 11/905,679

(22) Filed: Oct. 3, 2007

(65) Prior Publication Data

US 2008/0042286 A1 Feb. 21, 2008

Related U.S. Application Data

(62) Division of application No. 11/277,933, filed on Mar. 29, 2006, now abandoned.

(30) Foreign Application Priority Data

May 30, 2005 (JP) ............................. 2005-157180

(51) Int. Cl.
*H01L 23/48* (2006.01)
(52) U.S. Cl. .................. 257/758; 257/301; 257/350; 257/379; 257/532; 257/E21.252; 257/E21.274; 257/E21.311; 438/243; 438/957
(58) Field of Classification Search ............. 257/350, 257/379, 532, 301, 758; 438/957, 243
See application file for complete search history.

(56) References Cited

U.S. PATENT DOCUMENTS 6,391,707 B1 * 5/2002 Dirnecker et al. .......... 438/250

| 7,476,922 | B2 * | 1/2009 | Won et al. .................. 257/301 |
| 2003/0183862 | A1 | 10/2003 | Jin et al. |
| 2004/0097034 | A1 | 5/2004 | Sandhu et al. |
| 2005/0063140 | A1 | 3/2005 | Hackler et al. |
| 2006/0157766 | A1 * | 7/2006 | Won et al. ................ 257/296 |

FOREIGN PATENT DOCUMENTS

JP 2003-031691 1/2003
JP 2003-133414 5/2003

OTHER PUBLICATIONS

Washio et al. "A 0.2-μm 180-GHz-$f_{max}$ 6.7-ps-ECL SOI/HRS Self-Aligned SEG SiGe HBT/CMOS Technology for Microwave and High-Speed Digital Applications", IEEE International Electron Devices Meeting (IEDM), pp. 741-742, 2000.

* cited by examiner

*Primary Examiner*—A. Sefer
(74) *Attorney, Agent, or Firm*—Rabin & Berdo, P.C.

(57) ABSTRACT

A semiconductor device comprises a substrate, a first conductive film, a first insulation film, a second insulation film, a second conductive film, and a third conductive film. The first conductive film is formed on the substrate. The first insulation film is formed on the first conductive film and has a first opening. The first opening is formed as having multiple crossing trenches each having a predetermined width. The second insulation film is formed on the sides and bottom of the first opening. The second conductive film is formed on the second insulation film in the interior of the first opening. The third conductive film is formed on the second insulation film and the second conductive film.

10 Claims, 12 Drawing Sheets

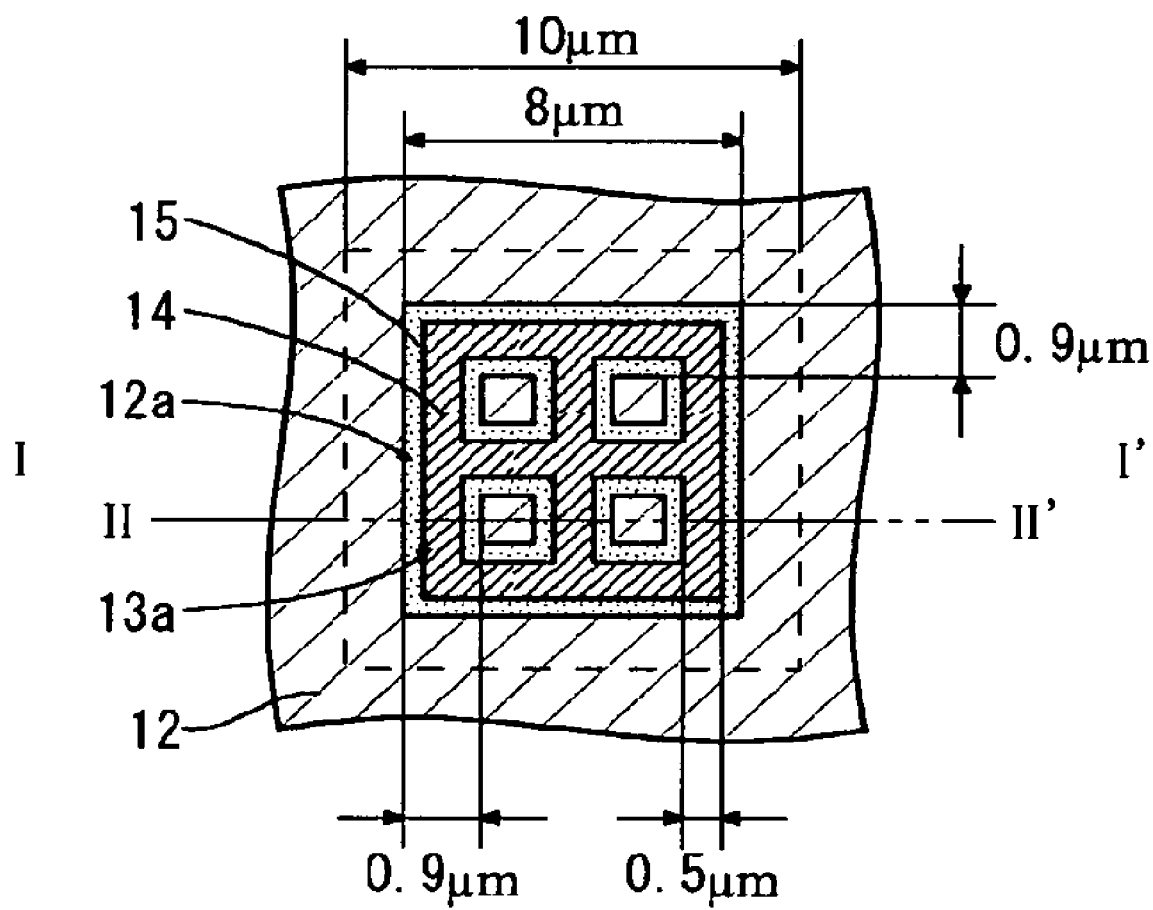

REGION A

SEMICONDUCTOR DEVICE

CROSS-REFERENCE TO RELATED APPLICATION

This application is a division of parent U.S. application Ser. No. 11/277,933, filed Mar. 29, 2006, and furthermore claims the benefit of priority of Japanese application 2005-157180, filed on Mar. 30, 2005. The disclosures of the parent US application and the Japanese priority application are hereby incorporated by reference in their entirety.

BACKGROUND OF THE INVENTION

1. Field of the Invention

The present invention relates to a semiconductor device which in particular is provided with a capacitive element having a MIM (Metal-Insulator-Metal) structure. Moreover, the present invention also relates to a method of manufacturing such semiconductor device.

2. Background Information

A common LSI (Large Scale integration) semiconductor is composed of various basic elements integrated to high density. The basic elements incorporated in a LSI semiconductor can be classified into two prominent categories, which are active elements and inactive elements.

One typical active element would be a transistor. There are several types of transistors such as a bipolar junction transistor (BJT), a junction field effect transistor (JFET), a metal oxide semiconductor field effect transistor (MOSFET), and so forth. Besides silicon (Si), which is commonly used as a material for forming a transistor, it is also possible to use a compound semiconductor such as gallium arsenide (GaAs), indium phosphide (InP) or the like.

On the other hand, a typical inactive element would be a resistive element or a capacitive element. Generally, such inactive element is formed using various conductive films and insulation films formed in the processes of forming a transistor. For instance, a capacitive element is usually formed having two layers of polysilicon electrodes and an interlayer of a silicon nitride film between the two layers of polysilicon electrodes.

In recent years, the signal processing speed of a LSI semiconductor has been improving rapidly with the increase in speed in transistor operations. On the other hand, due to the increase in communications traffic, it will be necessary to further increase the speed of LSI operations. Under such circumstances, it will be necessary to have a capacitive element with a high responsivity.

Generally, a delay of an electric signal is generated due to the coupling of a resistance (R) and a capacitance (C). Quantitatively, the amount of delay in a signal is determined based on a time constant that can be obtained by CXR. With respect to the capacitance (C) of a capacitive element, the capacitive element itself is an unchangable function. Accordingly, in order to prevent unnecessary signal delay, it is necessary to reduce the resistance (R) of the capacitive element. However, because a conventional capacitive element uses polysilicon, for instance, as its electrode, the parasitic resistance tends to become large, and thereby, an unnecessary time constant has to be added.

In order to cope with such problems, in recent years, a capacitive element having an MIM structure using a metal wiring as an electrode, such as the one disclosed in Washio, et al., "A 0.2-μm 180-GHz-fmax 6.7-ps-ECL SOI/HRS Self-Aligned SEG SiGe HBT/CMOS Technology for Microwave and High-Speed Digital Applications", IEEE International Electron Devices Meeting (IEDM), pp. 741-742, 2000 (hereinafter referred to as Non-Patent Reference 1), has come to be widely used. In the following, conventional technology relating to such capacitive element will be referred to as Prior Art Technology 1.

Now, a method of manufacturing a capacitive element having an MIM structure according to Prior Art Technology 1 will be described. Normally, in a typical manufacturing method, formation of various component elements, formation of insulation films after the component elements are formed, formation of contacts for connecting the component elements with wirings, etc. are supposed to be conducted in advance. In the following description, only processes for forming the MIM structure will be briefly described, and the other processes with respect to the above formation of component elements etc., for instance, will be omitted.

In this conventional manufacturing method, first, a semiconductor wafer (hereinafter to be referred to simply as a wafer) having an insulation film formed on a surface thereof is prepared, and a metal film is formed on the entire upper surface of this wafer. Then the metal film is processed using known photolithographic and etching processes. By these processes, a first metal pattern including a lower electrode of the capacitive element and other metal patterns is formed.

Next, an insulator is deposited over the entire surface of the wafer to form an insulation film, after which a surface of the insulation film is planarized by CMP (Chemical and Mechanical Polishing) to form an interlayer insulation film in which the thickness from the surface of the first metal pattern is about 6000 Å (angstrom), for instance.

Next, by etching the interlayer insulation film on the lower electrode in the first metal pattern, an opening having a diameter slightly smaller than that of the lower electrode is formed. Then, using a plasma CVD (Chemical Vapor Deposition) method, an HDP (High-Density Plasma) film, which is an insulation film, is formed on the entire surface of the wafer, i.e., on the interlayer insulation film and inside the opening, with a thickness of about 2000 Å.

Next, a contact hole with an opening diameter about 0.5 μm is formed over a region where the capacitive element is not formed, and tungsten (W) is deposited over the entire surface of the wafer to the thickness of about 8000 Å, in order to form contact plugs. During this time, the inside of the contact hole will be filled with tungsten (W) while the inside of the opening covered with the HDP film will also be filled up with tungsten.

Next, by etching back the entire surface of the wafer, the tungsten film over the interlayer insulation film is removed while leaving the tungsten inside the contact hole. Here, the tungsten remaining inside the contact hole functions as the contact plug for electrically connecting the upper and lower layers sandwiching the interlayer insulation film in between.

Then, a metal film is formed over the entire surface of the wafer, after which the metal film is processed using known photolithographic and etching processes to form a second metal pattern having an upper electrode of the capacitive element and other metal patterns. By these processes, a capacitive element having an MIM structure can be formed.

However, normally, the diameter of the opening formed for the capacitive element is considerably larger than the diameter of the contact hole. Therefore, in the process of removing the tungsten film over the interlayer insulation film, a portion of the tungsten will remain on the inner surface of the opening in the form of sidewalls. Such residual tungsten film may be a factor leading to problems such as the peeling off of a film formed on the tungsten film, and the like. As a result, this may cause other problems, such as defects in manufacturing processes and a decrease in a yield ratio.

One conventional method that resolves such problems is introduced in Japanese Laid-Open Patent Application No. 2003-31691 (hereinafter referred to as Patent Reference 1), for instance. In Patent Reference 1, the opening normally used in the capacitive element is replaced with multiple contact holes in order to prevent unnecessary tungsten film from remaining in the form of sidewalls. In the following, this technology will be referred to as Prior Art Technology 2.

Furthermore, another conventional method is introduced in Japanese Laid-Open Patent Application No. 2003-133414 (hereinafter referred to as Patent Reference 2), for instance. In Patent Reference 2, the opening normally used in the capacitive element is replaced with a liner opening trench having the same width as the diameter of the contact hole in order to prevent unnecessary tungsten film from remaining in the form of sidewalls. In the following, this technology will be referred to as Prior Art Technology 3.

However, according to Prior Art Technology 2 or 3, since multiple contact holes or a linear opening trench is used for the opening over the lower electrode, an area of the upper electrode adjacent to the lower electrode has to become smaller, which results in the reduction of the capacitive density of the capacitive element. Therefore, in order to obtain a desired capacitance, it is necessary to enlarge an area between the electrodes of the capacitive element, and this leads to a problem of increasing size of a semiconductor device.

In view of the above, it will be apparent to those skilled in the art from this disclosure that there exists a need for an improved semiconductor device and an improved method of manufacturing a semiconductor device. This invention addresses this need in the art as well as other needs, which will become apparent to those skilled in the art from this disclosure.

SUMMARY OF THE INVENTION

It is therefore an object of the present invention to resolve the above-described problems, and to provide a semiconductor device which is capable of preventing problems such as defects in manufacturing processes and a decrease in the yield ratio from occurring while preventing an increase in size, and a method of manufacturing such semiconductor device.

In accordance with a first aspect of the present invention, a semiconductor device comprises a substrate, a first conductive film, a first insulation film, a second insulation film, a second conductive film, and a third conductive film. The first conductive film is formed on the substrate. The first insulation film is formed on the first conductive film and has a first opening. The first opening is formed to have multiple crossing trenches each having a predetermined width. The second insulation film is formed on the side and the bottom of the first opening. The second conductive film is formed on the second insulation film inside the first opening. The third conductive film formed on the second insulation film and the second conductive film.

In accordance with a second aspect of the present invention, a semiconductor device comprises a substrate, a first conductive film, a first insulation film, a second insulation film, a second conductive film, and a third conductive film. The first conductive film is formed on the substrate and has a first opening. The first opening has a predetermined width. The first insulation film is formed on the first conductive film and has a second opening over the first opening. The second opening has a predetermined width. The second insulation film is formed on the sides of the first and second openings. The second conductive film is formed on the second insulation film inside the first and second openings. The third conductive film formed on the second insulation film and the second conductive film.

In accordance with a third aspect of the present invention, a method of manufacturing a semiconductor device comprises the steps of: preparing a substrate; forming a first conductive film on the substrate; forming a first insulation film on the substrate and the first conductive film; forming a first opening having a predetermined width in the first insulation film formed on the first conductive film; forming a second insulation film on the side surface and the bottom of the first opening; forming a second conductive film on the second insulation film inside the first opening; and forming a third conductive film over the first insulation film and on the second insulation film and the second conductive film.

In accordance with a fourth aspect of the present invention, a method of manufacturing a semiconductor comprises the steps of: preparing a substrate; forming a first conductive film on the substrate; forming a first insulation film on the substrate and the first conductive film; forming a first opening having a predetermined width in the first insulation film formed on the first conductive film; forming a second opening, of which bottom does not contact with the substrate, in the first conductive film exposed by the first opening; forming a second conductive film on a side of the first opening and on a side and a bottom of the second opening; forming a second conductive film on the second insulation film inside the first and second openings; and forming a third conductive film over the first insulation film and on the second insulation film and the second conductive film.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIG. 2 is a sectional view showing the structure of a horizontal plane section of a capacitive element according to the first embodiment of the present invention taken along line I-I' shown in FIG. 1;

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

First, a first embodiment of the present invention will be described in detail with reference to the drawings. This embodiment will show a semiconductor device having a capacitive element and a second element formed on a single support substrate, as an example of the present invention.

Structure

Figure 1:
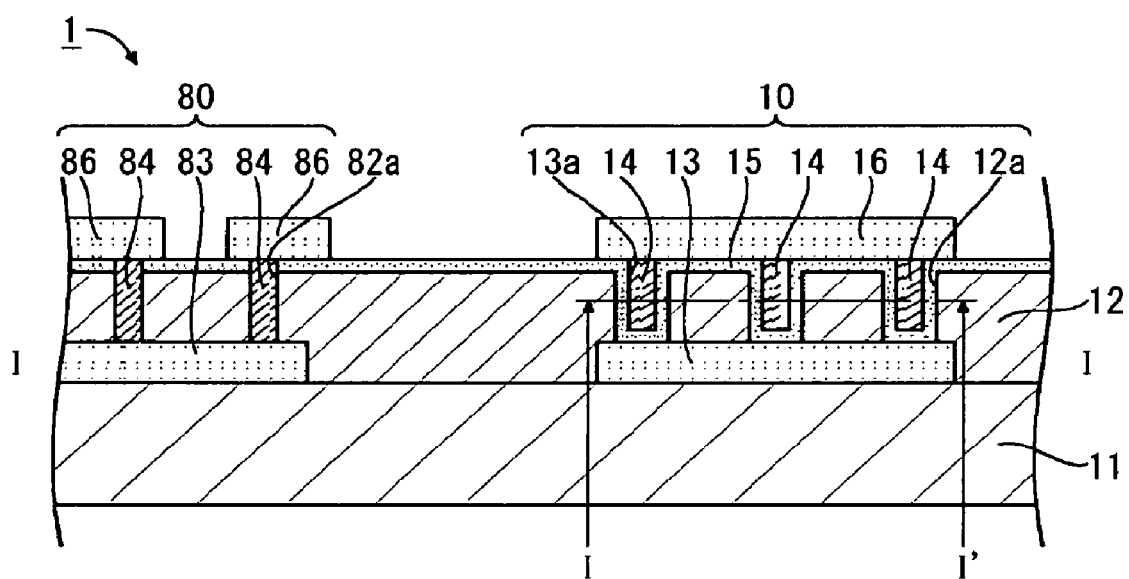
FIG. 1 is a sectional view of a semiconductor device according to a first embodiment of the present invention.

FIG. 1 is a sectional view of a semiconductor device 1 according to the first embodiment of the present invention. FIG. 1 shows a sectional structure of the semiconductor device 1 cut off at a plane which is perpendicular to a support substrate 11, and includes a capacitive element 10 and a first element 80.

As mentioned above and shown in FIG. 1, the semiconductor device 1 has a structure in which the capacitive element 10 and a first element 80 are formed on the support substrate 11. Here, the first element 80 might be a transistor, a resistive element or the like. In this embodiment, for convenience of explanation, the first element 80 is has one or more contact plugs 84 which fill the interior of one or more contact holes.

Capacitive Element

As shown in FIG. 1, the capacitive element 10 has a lower electrode (i.e. first conductive film) 13 formed on the support substrate 11, an interlayer insulation film (i.e. first insulation film) 12 formed on the lower electrode 13 and on the support substrate 11, an insulation film (i.e. second insulation film) 15 formed on the interlayer insulation film 12 and on the sides and bottom of an opening 12a formed in the interlayer insulation film 12 over the lower electrode 13, an electrode (i.e. second conductive film) (hereinafter to be referred to as an intra-opening electrode) 14 formed inside an opening 13a over the lower electrode 13 after the insulation film 15 is formed, and an upper electrode (i.e. third conductive film) 16 formed in a region opposite to the lower electrode 13 with the interlayer insulation film 12 formed therebetween, and the insulation film 15 and the intra-opening electrode 14 formed between the upper electrode 16 and the lower electrode 13.

The intra-opening electrode 14 is electrically connected to the upper electrode 16. Thereby, the intra-opening electrode 14 functions as a portion of the upper electrode 16 of the capacitive element 10. In addition, although it is not shown in the drawings, there is an insulation film between the support substrate 11 and the lower electrode 13, and this insulation film serves to prevent the lower electrode 13 from electrically connecting with the support substrate 11. This condition remains the same in the other embodiments of the present invention which will be described later on.

In the above-described structure, the support substrate 11 is a semiconductor substrate such as a p-type silicon substrate, for instance. However, this is not a limiting factor in this embodiment, and various types of substrates are also applicable.

For instance, the lower electrode 13 formed on the support substrate 11 is composed of, from the bottom layer, a titanium nitride (TiN) layer with a thickness of about 1000 Å, a titanium (Ti) layer with a thickness of about 500 Å, an aluminum silicon (AlSi) layer with a thickness of about 5000 Å, a titanium (TiN) layer with a thickness of about 500 Å and a titanium nitride (TiN) layer with a thickness of about 1000 Å. Accordingly, the lower electrode 13 is a multilayer conductive film (TiN/Ti/AlSi/Ti/TiN) having a total thickness of about 8000 Å. However, this is not a limiting factor in this embodiment, and the lower electrode 13 may be a single layer conductive film or a single layer or multilayer conductive film using other materials. The shape of an upper surface of the lower electrode 13 may be a right quadrangle which is 10 to 100 μm on one side, for instance. However, this is not a limiting factor in this embodiment, and the shape of the upper surface of the lower electrode 13 may be changed variously, such as a rectangle or the like.

The interlayer insulation film 12 formed on the support substrate 11 and the lower electrode 13 is a so-called CVD film which is formed by depositing silicon oxide ($Si_xO_y$), for instance, using a CVD method. As for a depositing material, various kinds of insulators such as silicon oxide, silicon nitride, and the like are applicable. In this interlayer insulation film 12, a portion thereof included in a region where the capacitive element 10 is supposed to be formed, i.e. a portion thereof sandwiched between the lower electrode 13 and the upper electrode 16, functions as a capacitive insulation film of the capacitive element 10. A surface of the interlayer insulation film 12 is planarized by a CMP method, for instance, and the interlayer insulation film 12 after being planarized has a thickness of about 6000 Å from the surface of the lower electrode 13, for instance.

This interlayer insulation film 12 has an opening 12a in a region over the lower electrode 13. This opening 12a is formed by arranging multiple linear trenches in a lattice pattern, one trench having a width of about 0.9 μm and a length equal to or shorter than the length of one side of the lower electrode 13, for instance. More details on the shape of the opening 12a will be described later on with reference to FIG. 2. The opening 12a exposes a portion of the upper surface of the lower electrode 13 formed underneath the interlayer insulation film 12, i.e., the opening 12a penetrates the interlayer insulation film 12.

As mentioned above, the insulation film 15 is formed on the interlayer insulation film 12. The insulation film 15 extends from an upper portion of the interlayer insulation film 12 to the inside of the opening 12a, and covers a portion of the lower electrode 13 exposed by the opening 12a at the bottom of the opening 12a. That is, the insulation film 15 in the region where the capacitive element 10 is supposed to be formed functions as a capacitive insulation film of the capacitive element 10. This insulation film 15 is a so-called HDP film, which is formed by depositing silicon oxide ($Si_xO_y$), for instance, using the plasma CVD method. By forming the insulation film 15, the opening over the lower electrode 13 changes from the opening 12a to the opening 13a. In this embodiment, the thickness of the insulation film 15 is considered to be 0.2 μm, for instance. Accordingly, the width of each linear trench constructing the opening 13a can be determined by subtracting double the thickness of the insulation film 15 from the width of the opening 12a. That is, the thickness of the opening 13a becomes about 0.5 μm. This is approximately the same as the diameter of contact holes 82a in the first element 80 which will be described later on.

A predetermined conductor is filled into the opening 13a to form the intra-opening electrode 14. Tungsten (W), copper (Cu), or the like may be used for the predetermined conductor for forming the intra-opening electrode 14. However, this is not a limiting factor in this embodiment, and various kinds of conductors are also applicable. The following describes a situation in which tungsten (W) is used as the conductor for forming the intra-opening electrode 14.

Over the lower electrode 13, the upper electrode 16 is formed while the interlayer insulation film 12, the insulation film 15, and the intra-opening electrode 14 are sandwiched between the lower electrode 13 and the upper electrode 16. The structure and material of the upper electrode 16 may be the same as the lower electrode 13. The upper electrode 16 is electrically connected with the intra-opening electrode 14 by contacting with the intra-opening electrode 14 as mentioned above. That is, the upper electrode 16 in the capacitive element 10 is made to electrically extend to the side of the lower electrode 13 by the intra-opening electrode 14. By this arrangement, the capacitive element 10 can have increased capacitance, and as a result, the desired capacitance can be obtained with a small sized device.

Second Element

On the other hand, the first element 80 has a lower layer conductive film 83 formed on the support substrate 11, the interlayer insulation film 12 formed on the lower layer conductive film 83 and the support substrate 11, the insulation film 15 formed on the interlayer insulation film 12, contact plugs 84 formed inside contact holes 82a that are formed in the interlayer insulation film 12 over the lower layer conductive film 83, and an upper layer conductive film 86 formed on the insulation film 15 and the contact plugs 84.

In the above structure, the support substrate 11, the interlayer insulation film 12 and the insulation film 15 are common to the first element 80 and the capacitive element 10. However, the insulation film 15 is not supposed to be formed inside the contact holes 82a that are formed in the interlayer insulation film 12.

The lower layer conductive film 83 formed on the support substrate 11 has the same layer structure as the lower electrode 13 or the upper electrode 16 in the capacitive element 10. In the interlayer insulation film 12 on this lower layer conductive film 83, the above-mentioned contact holes 82a are formed. The contact holes 82a have a cylindrical shape of about 0.5 μm in diameter, for instance. Furthermore, a predetermined conductor is filled into each contact hole 82a to form the contact plug 84. As for the predetermined conductor for forming the contact plugs 84, it is possible to apply the same material as used in forming the intra-opening electrode 14 in the capacitive element 10.

On the lower layer conductive film 83, the upper layer conductive film 86 is formed, and the contact hole 84 and the inter layer insulation film 12 are sandwiched between the lower layer conductive film 83 and the upper layer conductive film 86. The upper layer conductive film 86 has the same layer structure as the lower electrode 13 or the upper electrode 16 in the capacitive element 10. The upper layer conductive film 86 is electrically connected with the lower layer conductive film 83 via the contact plugs 84. That is, the lower layer conductive film 83 in the first element 80 is electrically drawn out up to the upper layer conductive film 86 on the interlayer insulation film 12 by the contact plugs 84.

Form of Horizontal Plane Section of Capacitive Element

Next, the form of a horizontal plane section between the lower electrode 13 and the upper electrode 16 in the capacitive element 10 will be described in detail with reference to FIG. 2.

FIG. 2 is a sectional view showing a structure of a horizontal plane section of the capacitive element 10 taken along line I-I' shown in FIG. 1. That is, FIG. 2 is a sectional view showing a horizontal plane section between the lower electrode 13 and the upper electrode 16 in the capacitive element 10. In addition, FIG. 1 shows the sectional structure of the semiconductor device 1 which includes a plane II-II' shown in FIG. 2.

As shown in FIG. 1 and FIG. 2, the opening 12a according to this embodiment has a lattice structure made up of multiple linear trenches arranged in predetermined intervals, three of which being vertical and three of which being horizontal. Here, each linear trench is about 0.9 μm in width and about 8 μm in length. Since the opening 12a penetrates the interlayer insulation film 12, the depth of each of the opening trenches is the same as the thickness of the interlayer insulation film 12. Furthermore, in this embodiment, since the shape of the upper surface of the lower electrode 13 is supposed to be a right quadrangle which is about 10 μm on one side, the opening 12a will have a 1 μm margin from each edge of the lower electrode 13.

Furthermore, as described above, the inner sides and the bottom of the opening 12a have the insulation film 15 formed to a thickness of about 0.2 μm. Therefore, by forming the insulation film 15, the width of the opening (corresponding to the opening 13a) over the lower electrode 13 will narrow to about 0.5 μm. Accordingly, the intra-opening electrode 14 formed by filling tungsten (W) inside the opening 13a will be about 0.5 μm in width. In other words, in this embodiment, the width of the intra-opening electrode 14 formed for the capacitive element 10 is about the same as the diameter of each contact holes 84 in the first element 80. Thus, no large depression will be formed in the upper portion of the intra-opening electrode 14 in the manufacturing processes. This is because in the process of removing the tungsten film on the interlayer insulation film 12, overetching will normally be conducted to the extent that no depression will be formed on the upper portion of the contact hole 84. As a result, it will be possible to prevent any tungsten film from remaining inside the opening 13a in a form of sidewalls, and such residual tungsten film may be a factor leading to problems such as the peeling off of a film formed on the tungsten film. Furthermore, it will be possible to prevent defects in the manufacturing processes and a decrease in the yield ratio from occurring.

Comparison

Figure 3A:
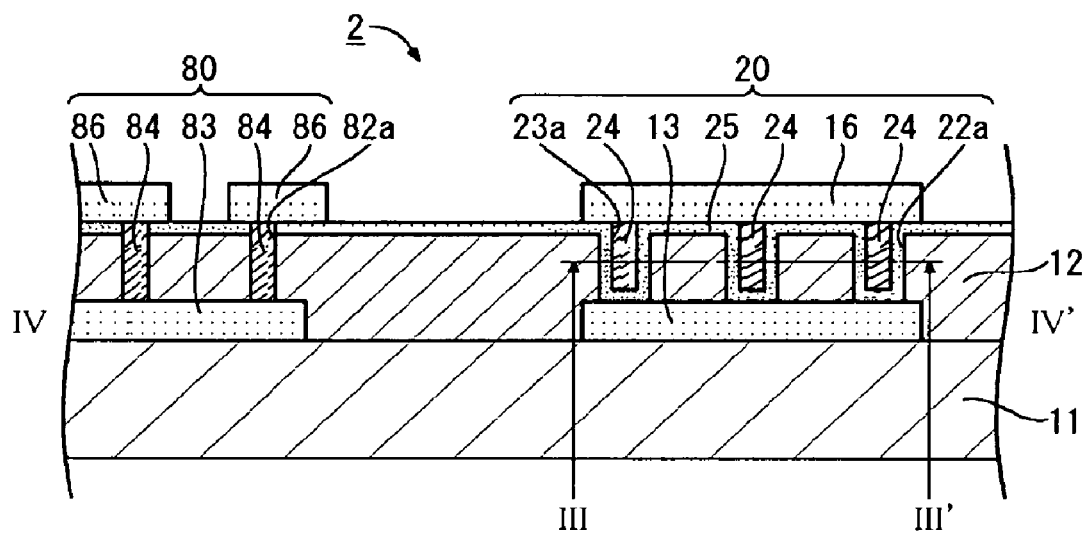
FIG. 3A is a sectional view of a comparative example of a semiconductor device according to the first embodiment of the present invention.
Figure 3B:
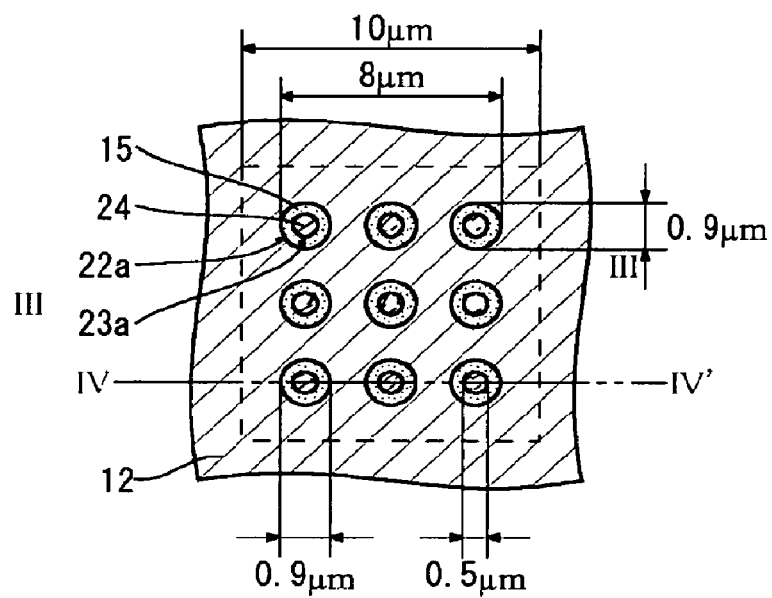
FIG. 3B is a sectional view showing the structure of a horizontal plane section of a capacitive element taken along a line III-III' in FIG. 3A.
Figure 4A:
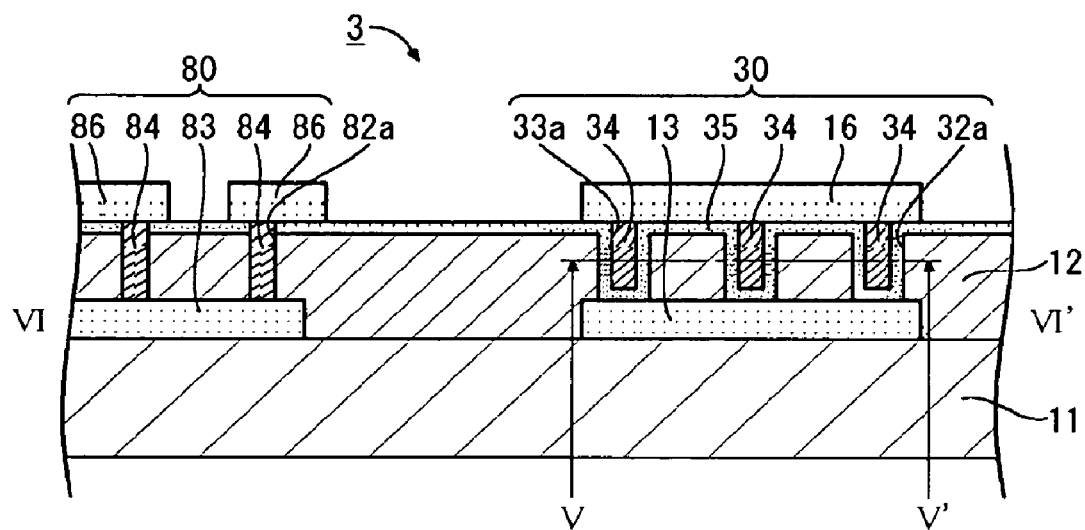
FIG. 4A is a sectional view of another comparative example of a semiconductor device according to the first embodiment of the present invention.

Now, in FIG. 3A and FIG. 3B, a semiconductor device 2, in which openings over the lower electrode 13 after an insulation film 25 is formed to have the same shape as the contact holes 82a in terms of a horizontal plane section, is shown as a comparative example 1 with respect to the semiconductor device 1 according to the first embodiment of the present invention. Furthermore, in FIG. 4A and FIG. 4B, a semiconductor device 3, in which openings over the lower electrode 13 after an insulation film 35 is formed are formed as liner trenches, is shown as a comparative example 2 with respect to the semiconductor device 1 according to the first embodiment of the present invention. FIG. 3A is a sectional view showing a sectional structure of the semiconductor device 2 cut off at a plane perpendicular to the support substrate 11, while including a capacitive element 20 of the comparative example 1 and the first element 80, and FIG. 3B is a sectional view showing the structure of a horizontal plane section of the capacitive element 20 taken along a line III-III' shown in FIG. 3A. In addition, FIG. 4A is a sectional view showing a sectional structure of the semiconductor device 3 cut off at a plane perpendicular to the support substrate 11, while including a capacitive element 30 of the comparative example 2 and the first element 80, and FIG. 3B is a sectional view showing the structure of a horizontal plane section of the capacitive element 30 taken along a line IV-IV' shown in FIG. 4A.

As shown in FIG. 3A and FIG. 3B, when forming openings 23a over the lower electrode 13 after the insulation film 25 is formed so as to have the same shape as the contact holes 82a, i.e. when forming openings 22a in which each have a cylindrical shape about 0.9 μm in diameter on the interlayer insulation film 12 that is formed over the lower electrode 13, intra-opening electrodes 24 to be formed inside the openings 23a after the insulation film 25 is being formed will have a cylindrical shape about 0.5 μm in diameter, respectively. As can be seen by comparing the total area of the horizontal plane section of the intra-opening electrodes 24 (q.v. FIG. 3B) with the area of the horizontal plane section of the intra-opening electrode 14 (q.v. FIG. 2) of the first embodiment of the present invention, the area of the intra-opening electrode 14 of the first embodiment of the present invention is larger. In other words, a larger area of the intra-opening electrode 14 electrically extends toward the lower electrode 13 from the upper electrode 16. This means that the capacitive element 10 of the first embodiment of the present invention is capable of obtaining higher capacitive density, and as a result, the first embodiment of the present invention is capable of obtaining the desired capacitance with a smaller sized device.

Figure 4B:
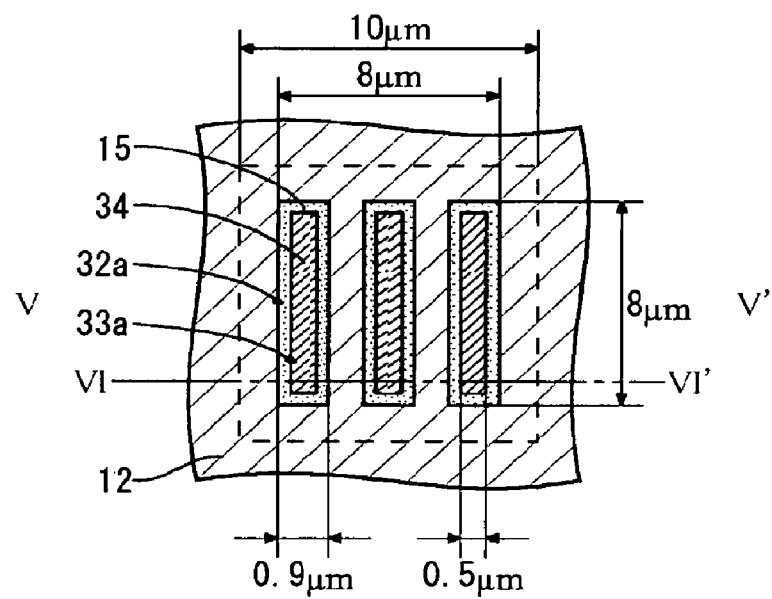
FIG. 4B is a sectional view showing the structure of a horizontal plane section of a capacitive element taken along line V-V' in FIG. 4A.

On the other hand, as shown in FIG. 4, when forming openings 33a over the lower electrode 13 after the insulation film 35 is formed so as to be liner trenches, i.e., when forming liner openings 32a about 0.9 μm in width on the interlayer insulation film 12 that is formed over the lower electrode 13, intra-opening electrodes 34 to be formed inside the openings 33a after the insulation film 15 is formed will have a linear shape about 0.5 μm in width, respectively. As can be seen by comparing the total area of the horizontal plane section of the intra-opening electrodes 34 (q.v. FIG. 4B) with the area of the horizontal plane section of the intra-opening electrode 14 (q.v. FIG. 2) of the first embodiment of the present invention, the area of the intra-opening electrode 14 of the first embodiment of the present invention is larger. In other words, the larger area of the intra-opening electrode 14 electrically extends toward the lower electrode 13 from the upper electrode 16. This means that the capacitive element 10 of the first embodiment of the present invention is capable of obtaining a higher capacitive density, and as a result, the first embodiment of the present invention is capable of obtaining the desired capacitance with a smaller sized device.

As described above, the first embodiment of the present invention adopts a structure in which the opening has multiple linear trenches crossing one another, each linear trench having a width that is about the same as a diameter of the contact hole 82a in the first element 80. With this structure, it is possible to prevent tungsten film from remaining inside the opening in a form of sidewalls, wherein such residual tungsten film may be a factor leading to problems such as the peeling off of a film formed on the tungsten film, and at the same time, it is possible to obtain a higher capacitive density. As a result, possible defects in the manufacturing processes and a decrease in the yield ratio can be prevented, and at the same time, it is possible to prevent the semiconductor device 1 from becoming larger in size.

Manufacturing Method

Now, a method of manufacturing the semiconductor device 1 according to the first embodiment of the present invention will be described in detail with reference to the drawings.

In this manufacturing method, first, a support substrate 11 is prepared. Next, using the CVD method or a sputtering method, for instance, a conductive film (which is also referred to as a multilayer conductive film) 13A having a multilayer structure is formed on the support substrate 11 by sequentially depositing a titanium nitride (TiN) layer 13b with a thickness of about 1000 Å, a titanium (Ti) layer 13c with a thickness of about 500 Å, an aluminum silicon (AlSi) layer 13d with a thickness of about 5000 Å, a titanium layer 13e with a thickness of about 500 Å and a titanium nitride layer 13f with a thickness of about 1000 Å.

Figure 5A:
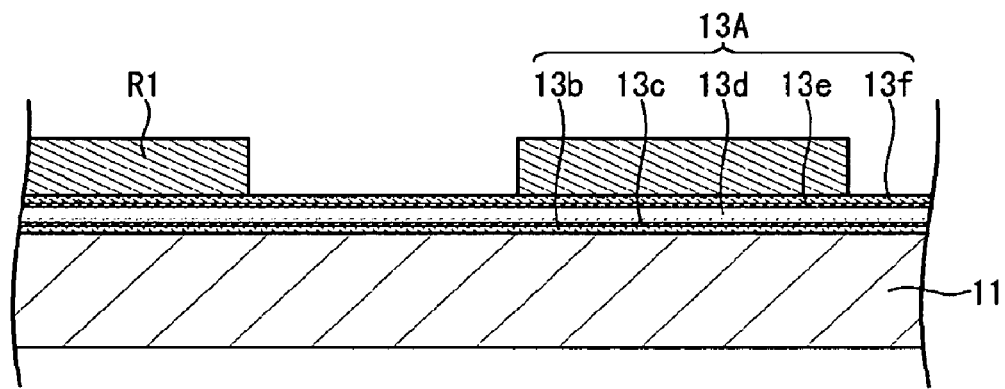
FIG. 5A to FIG. 7B are diagrams showing processes of manufacturing the semiconductor device according to the first embodiment of the present invention.
Figure 5B:
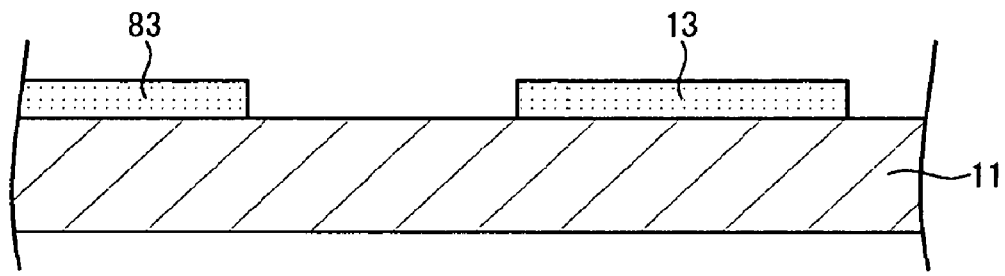

Next, by conducting known photolithographic processes on the multilayer conductive film 13A, a resist pattern R1 having the same upper shape as a lower electrode 13 (which will be formed in a post process) and a lower layer conductive film 83 (which will be formed in a post process) is formed on the multilayer conductive film 13A, as shown in FIG. 5A. Next, by etching the multilayer conductive film 13A while using the resist pattern R1 as a mask, the multilayer conductive film 13A is processed into the lower electrode 13 and the lower layer conductive film 83, as shown in FIG. 5B. After forming the lower electrode 13 and the lower layer conductive film 83, the resist pattern R1 is removed.

Figure 5C:
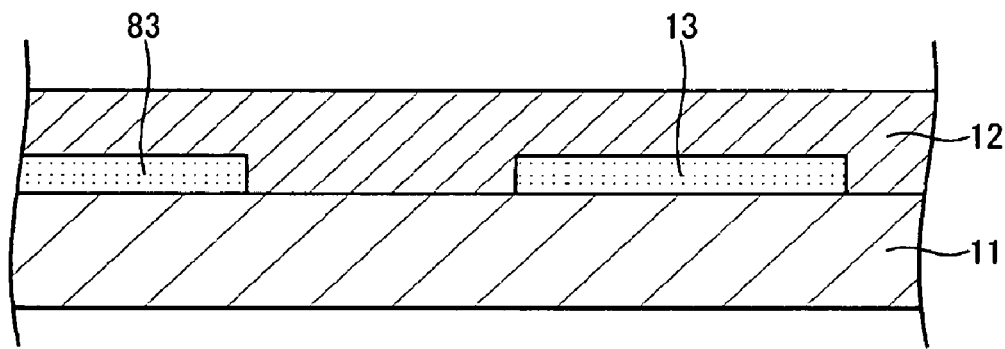

Next, silicon oxide is deposited on the support substrate 11 and the lower electrode 13 using the CVD method, for instance, after which the upper surface of the deposited silicon oxide film is planarized using the CMP method. By this process, an interlayer insulation film 12 having a thickness of about 6000 Å from the upper surface of the lower electrode 13, is formed on the lower electrode 13, the lower layer conductive film 83 and the support substrate 11, as shown in FIG. 5C.

Figure 6A:
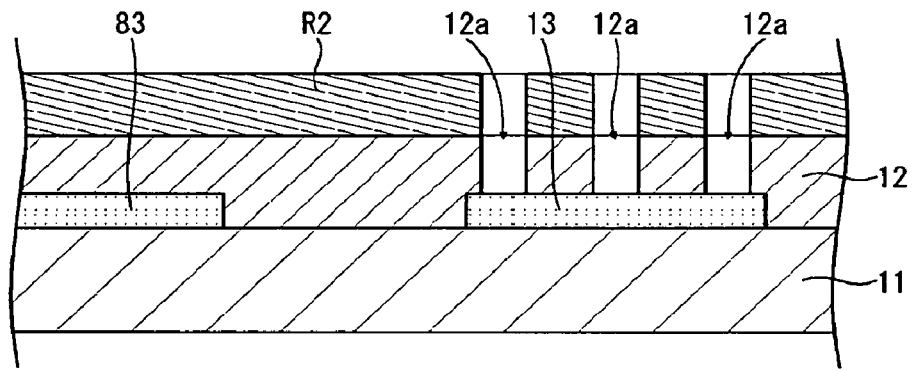

Next, by conducting known photolithographic processes on the interlayer insulation film 12, a resist pattern R2 having an opening which has the same opening shape as an opening 12a (which will be formed in a post process) is formed on the interlayer insulation film 12. Next, by etching the interlayer insulation film 12 over the lower electrode 13 while using the resist pattern R2 as a mask, the opening 12a, which is constructed as having multiple linear trenches arranged in a lattice pattern, is formed over the lower electrode 13, with the width of each linear trench being about 0.9 μm, as shown in FIG. 6A. After forming the opening 12a, the resist pattern R2 is removed.

Figure 6B:
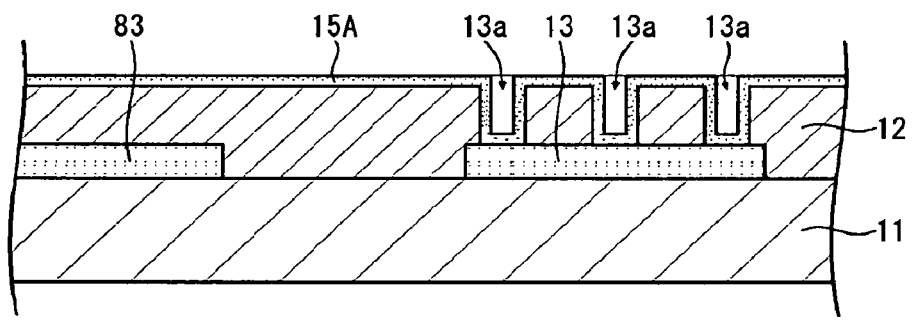

Next, by depositing silicon oxide ($Si_xO_y$) on the interlayer insulation film 12 having the opening 12a using a plasma CVD method, for instance, an insulation film 15A, which is an HDP film having a thickness of about 0.2 μm, is formed on the interlayer insulation film 12 and on the sides and bottom of the opening 12a, as shown in FIG. 6B. By this process, the opening 12a will become an opening 13a which is constructed to have multiple linear trenches arranged in a lattice pattern, with the width of each linear trench being narrower than the opening 12a by double the thickness of the insulation film 15A (i.e. the insulation film 15).

Figure 6C:
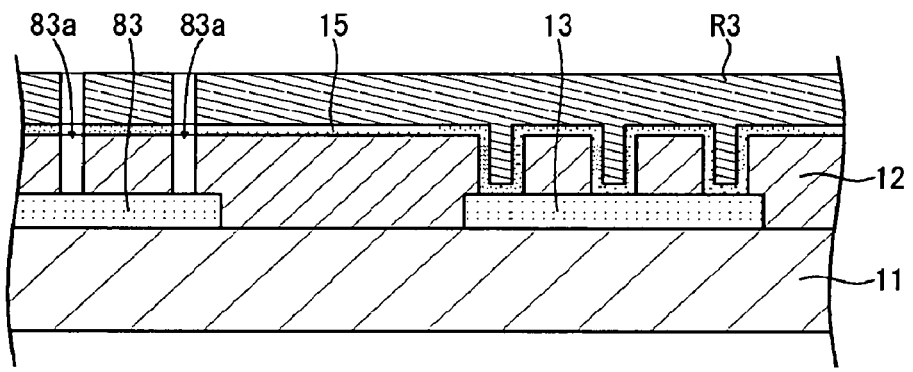

Next, by conducting known photolithographic processes on the insulation film 1SA, a resist pattern R3 having openings formed over a region where the first element 80 will be formed is formed on the insulation film 15A, the openings having the same upper shape as contact holes 82a (which will be formed in the post process). Next, by etching the insulation film 15A and the interlayer insulation film 12 while using the resist pattern R3 as a mask, contact holes 82a each having a diameter of about 0.5 μm are formed over the lower layer conductive film 83, as shown in FIG. 6C. By this process, the insulation film 15A is processed into an insulation film 15. After forming the contact holes 83a, the resist pattern R3 is removed.

Figure 7A:
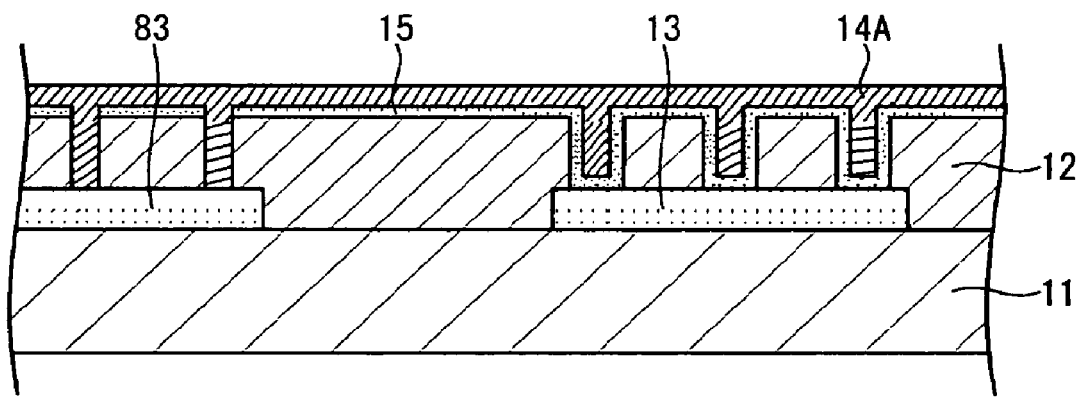

Next, by depositing tungsten (W) over the entire surface of the support substrate 11 using the CVD method or a sputtering method, for instance, a tungsten film 14A is formed on the insulation film 15 and inside the opening 13a and the contact holes 83a, as shown in FIG. 7A.

Figure 7B:
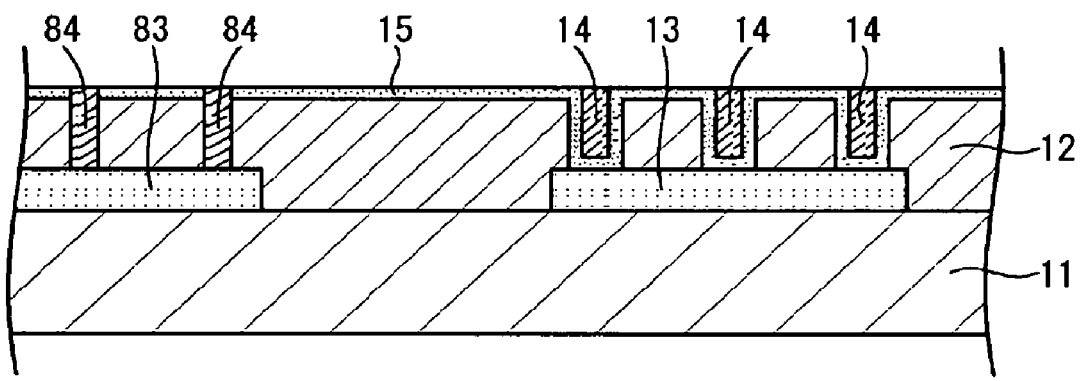

Next, by etching back the tungsten film 14A, the tungsten film 14A over the interlayer insulation film 12 is removed while leaving parts of the tungsten film 14A inside the opening 13a and the contact holes 83a. By these processes, an intra-opening electrode 14 is formed inside the opening 13a, and contact plugs 84 are formed inside the contact holes 83a, as shown in FIG. 7B.

Next, by using the same process described above with reference to FIG. 5A, a multilayer conductive film having the same structure as the multilayer conductive film 13A is formed on the intra-opening electrode 14, the contact plugs 84, and the insulation film 15. Then, by conducting known photolithographic processes on the multilayer conductive film, a resist pattern having the same upper shape as an upper electrode 16 (which will be formed in a post process) and an upper layer conductive film 86 (which will be formed in a post process) is formed. Then, by etching the multilayer conductive film while using the resist pattern as a mask, the upper electrode 16 and the upper layer conductive film 86 are formed.

By performing the processes described above, the semiconductor device 1 shown in FIG. 1 can be acquired.

As described above, the semiconductor device 1 according to the first embodiment of the present invention has the support substrate (11) which is a semiconductor substrate, the lower electrode (13) formed on the support substrate (11), the insulation film (12) formed on the lower electrode (13) and which includes the opening (12a) formed over the lower electrode (13) having multiple trenches crossing one another, each multiple trench having a predetermined width, the insulation film (15) formed on the sides and the bottom of the opening (12a), the intra-opening electrode (14) formed on the insulation film (15) inside the opening (12a), and the upper electrode (16) formed on the insulation film (15) and the intra-opening electrode (14).

With this type of structure, in which the insulation film 15 is formed inside the opening 12a composed of multiple trenches each having a predetermined width, and the intra-opening electrode 14 is formed on this insulation film 15 inside the opening 12a, it is possible to make a width of each linear portion forming the intra-opening electrode 14 about the same as the width (or a diameter) of the contact plug 84. Therefore, it is possible to prevent tungsten film from remaining inside the opening 13a in the form of sidewalls at the time of forming the intra-opening electrode 14 and the contact plugs 84. As a result, possible defects in the manufacturing processes and a decrease in the yield ratio can be prevented.

Furthermore, by forming the opening 12a to have a structure in which multiple trenches each having a predetermined width cross one another, it is possible to enlarge the area of the opening 12a in terms of a horizontal plane section without enlarging the width of each trench. Therefore, it is possible to obtain higher capacitive density for the capacitive element 10, and as a result, it is possible to obtain the desired capacitance with a small sized device. This means that it is possible to prevent the semiconductor device 1 from becoming larger in size.

In addition, according to the manufacturing method of the semiconductor device 1 according to the first embodiment of the present invention, since the insulation film 15 functioning as a capacitive insulation film is formed after the opening 12a is formed in the interlayer insulation film 12, the etching process for forming the opening 12a will be made easier. In a situation in which an insulation film that is a capacitive insulation film is supposed to be formed before forming the opening 12a, at the time of etching the interlayer insulation film 12, it will be necessary to have a predetermined control for stopping the etching in order to prevent any short circuit from occurring between the intra-opening electrode 14 and the upper electrode 16 which are to be formed in the latter processes. On the other hand, according to the first embodiment of the present invention, the insulation film 15 is supposed to be formed after the opening 12a is formed, and therefore, it is not necessary to have any such particular control for stopping the etching.

Second Embodiment

Next, a second embodiment of the present invention will be described in detail with reference to the drawings. In the following, the same reference numbers will be used for the structural elements that are the same as the first embodiment, and redundant explanations of those structure elements will be omitted.

Structure

Figure 8A:
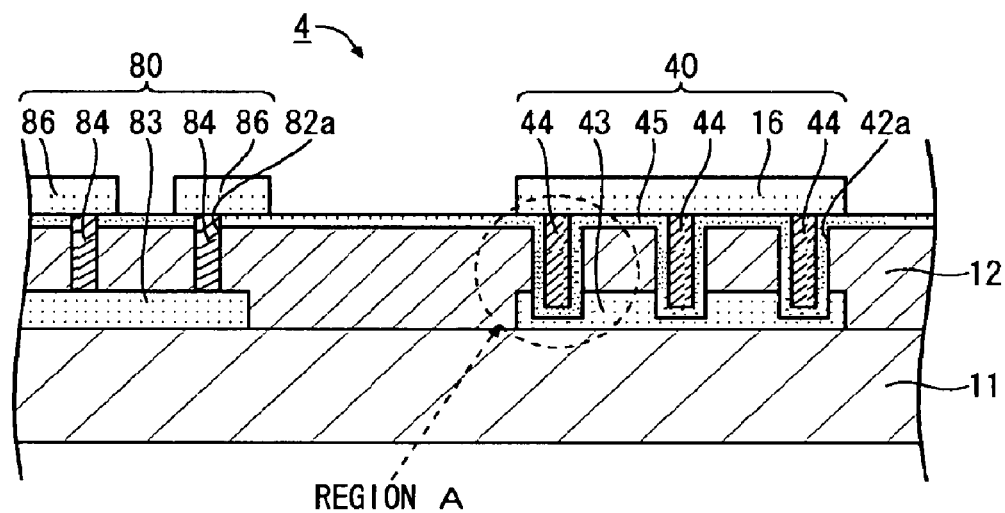
FIG. 8A is a sectional view of a semiconductor device according to a second embodiment of the present invention.
Figure 8B:
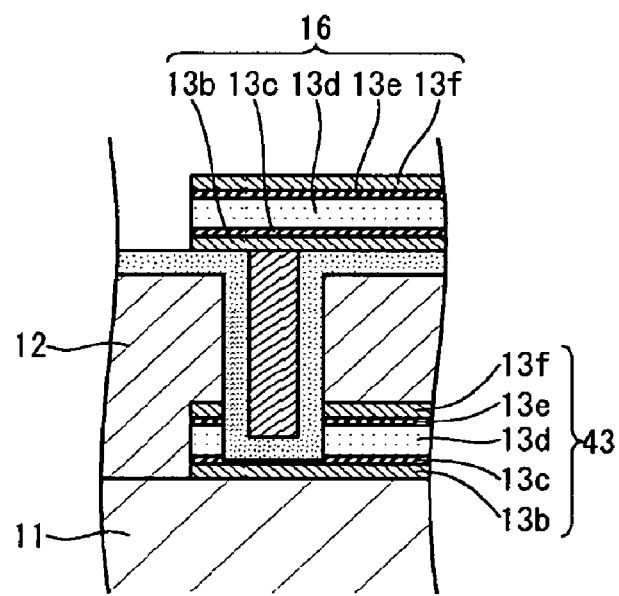
FIG. 8B is an enlarged sectional view of a region A in FIG. 8A.

FIG. 8A is a sectional view of a semiconductor device 4 according to the second embodiment of the present invention. FIG. 8A shows a sectional structure of the semiconductor device 4 cut off at a plane perpendicular to a support substrate 11, and includes a capacitive element 40 and the first element 80. FIG. 8B is an enlarged sectional view of a region A in FIG. 8A.

As shown in FIG. 8A and FIG. 8B, the semiconductor device 4 has the same structure as the semiconductor device 1 of the first embodiment, except that the capacitive element 10 constructed with the lower electrode 13, the opening 12a, the opening 13a, the intra-opening electrode 14, and the insulation film 15 is replaced with a capacitive element 40 constructed with a lower electrode 43, an opening 42a, an opening 43a, an intra-opening electrode 44, and an insulation film 45. In this structure, the opening 42a extends to the interior of the lower electrode 43 but the bottom thereof does not contact with the support substrate 11. Since the rest of the structure is the same as the structure of the semiconductor device 1 of the first embodiment, a detailed description thereof will be omitted.

In the above-described structure, for instance, the lower electrode 43 is composed of, from the bottom layer, a titanium nitride (TiN) layer 13b with a thickness of about 1000 Å, a titanium (Ti) layer 13c with a thickness of about 500 Å, an aluminum silicon (AlSi) layer 13d with a thickness of about 5000 Å, a titanium (TiN) layer 13e with a thickness of about 500 Å and a titanium nitride (TiN) layer 13f with a thickness of about 1000 Å. Accordingly, the lower electrode 43 is a multilayer conductive film (TiN/Ti/AlSi/Ti/TiN) having a total thickness of about 8000 Å (shown in FIG. 8B), as with the lower electrode 13 in the first embodiment. As described above, the opening 42*a* extends to the interior of the lower electrode 43. In FIG. 8A and FIG. 8B, the opening 42*a* extends to the interior of the titanium layer 13*c* located at a lower portion of the lower electrode 43.

The insulation film 45 of this embodiment has the same film as the insulation film 15 of the first embodiment. However, in this embodiment, since the opening 42*a* extends to the interior of the lower electrode 43, the insulation film 45 is formed to extend from the interior of the insulation film 12 to the interior of the lower electrode 43, and seals the opening 42*a* at the bottom of the opening 42*a*. Here, it is preferable that the opening 43*a* over the lower electrode 43 after the insulation film 45 is formed extends from the interior of the interlayer insulation film 12 to the interior of the lower electrode 43. In this case, the depth of the opening 43*a* should preferably be set to be larger than the thickness of the interlayer insulation film 12.

As with the intra-opening electrode 14 of the first embodiment, the intra-opening electrode 44 is a conductive film formed by filling the interior of the opening 43*a* with a predetermined conductor such as tungsten (W). Here, since the opening 43*a* extends to the interior of the lower electrode 43 as described above, the intra-opening electrode 44 formed inside the opening 43*a* also extends to the interior of the lower electrode 43. By having such a structure, it is possible to increase the area between the lower electrode 43 and the intra-opening electrode 44, i.e., the effective area which functions as a capacitive element. In other words, it is possible to achieve a higher capacitive density of the capacitive element 40. Accordingly, it is possible to obtain a semiconductor device 4 which is capable of obtaining a desired capacitance with a small sized device.

As with the structure shown in the first embodiment with reference to FIG. 2, for instance, the shape of the horizontal plane section of the opening 42*a* according to this embodiment has a lattice structure made up of multiple linear trenches arranged in predetermined intervals, some of which being vertical and the other of which being horizontal. Here, each linear trench is about 0.9 µm in width and about 8 µm in length. By applying such a structure, it is possible to achieve a semiconductor device 4 which is capable of obtaining the desired capacitance with a small sized device.

Manufacturing Method

Now, a method of manufacturing the semiconductor device 4 according to the second embodiment of the present invention will be described in detail with reference to the drawings. In the following, the same processes as the first embodiment will be described with reference to the first embodiment.

In this manufacturing method, first, the support substrate 11 is prepared as with the first embodiment. Next, using the CVD method or a sputtering method, for instance, the multilayer conductive film 13A is formed on the support substrate 11 by sequentially depositing a titanium nitride (TiN) layer 13*b* with a thickness of about 1000 Å, a titanium (Ti) layer 13*c* with a thickness of about 500 Å, an aluminum silicon (AlSi) layer 13*d* with a thickness of about 5000 Å, a titanium layer 13*e* with a thickness of about 500 Å and a titanium nitride layer 13*f* with a thickness of about 1000 Å.

Next, by conducting known photolithographic processes on the multilayer conductive film 13A, a resist pattern R1 having the same upper shape as a lower electrode 43 (which will be formed in a post process) and an under layer conductive film 83 (which will be formed in a post process) is formed on the multilayer conductive film 13A (q.v. FIG. 5A). Next, by etching the multilayer conductive film 13A while using the resist pattern R1 as a mask, the multilayer conductive film 13A is processed into the lower electrode 13 and the under layer conductive film 83 (q.v. FIG. 5B). After forming the lower electrode 13 and the under layer conductive film 83, the resist pattern R1 is removed.

Next, silicon oxide is deposited on the support substrate 11 and the lower electrode 13 using the CVD method, for instance, after which the upper surface of the deposited silicon oxide film is planarized using a CMP method. By this process, the interlayer insulation film 12, having a thickness of about 6000 Å from the upper surface of the lower electrode 13 to the upper surface of the interlayer insulation film 12, is formed on the lower electrode 13, the under layer conductive film 83, and the support substrate 11 (q.v. FIG. 5C).

Next, by conducting known photolithographic processes on the interlayer insulation film 12, a resist pattern R2 having an opening which has the same opening shape as an opening 42*a* (which has the same shape as the opening 12*a* and formed in a post process) is formed on the interlayer insulation film 12. Next, by etching the interlayer insulation film 12 over the lower electrode 13 while using the resist pattern R2 as a mask, the opening 12*a*, which is constructed as having multiple linear trenches arranged in a lattice pattern, is formed over the lower electrode 13, a width of each linear trench being about 0.9 µm (q.v. FIG. 6A). As for the conditions of etching the interlayer insulation film 12, it is possible to use a mixed gas of $C_4F_8$, CO, and $O_2$ as an etching gas. In this case, RF power may be set to 500 W (watt) and the pressure inside the chamber may be set to 40 mTorr. By etching the interlayer insulation film 12 under such conditions, portions of the lower electrode 13 are exposed. In addition, in this process, the resist pattern R2 is not removed.

Figure 9A:
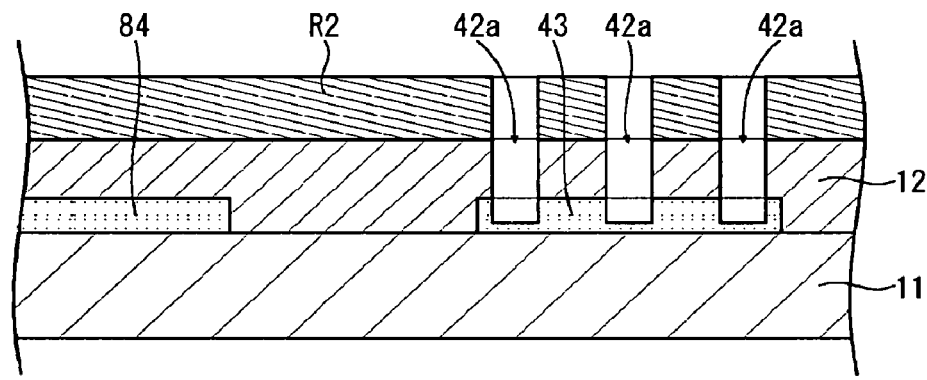
FIG. 9A to FIG. 10B are diagrams showing processes of manufacturing the semiconductor device according to the second embodiment of the present invention.

After forming the opening 12*a* described above, the titanium nitride film (TiN) 13*f*, the titanium layer 13*e*, the aluminum silicon (AlSi) layer 13*d*, and the titanium (Ti) layer 13*c* of the lower electrode 13 are etched sequentially while using the remaining resist pattern R2 as a mask, as shown in FIG. 9A. In this process, the etching of the lower electrode 13 is conducted so that a portion of the titanium layer 13*c* remains, and the entirety of the lowest titanium nitride layer 13*b* remains. As for the etching of the lower electrode 13, it is possible to use an ECR (Electron Cyclotron Resonance) plasma etching method with an optimized etching time. In this case, a mixed gas of $BCl_3$ and $Cl_2$ may be used as an etching gas, Mg power may be set to 700 W, PF power may be set to 70 W, and the pressure inside the chamber may be set to 1 Pa. Under such etching conditions, it is possible to process the lower electrode 13 into a lower electrode 43. The processed lower electrode 43 has an opening 42*a* whose bottom lies below the upper surface of the lower electrode 43. After processing the lower electrode 13 into the lower electrode 43, the resist pattern R2 is removed.

Figure 9B:
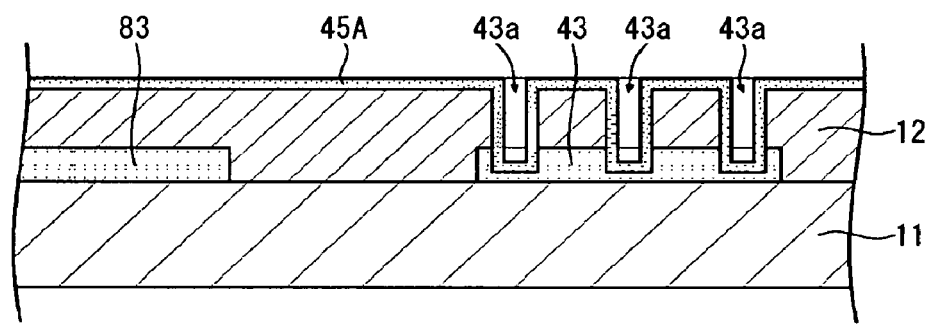

Next, by depositing silicon oxide ($Si_xO_y$) on the interlayer insulation film 12 having the opening 42*a* by using a plasma CVD method, for instance, an insulation film 45A, which is an HDP film having a thickness of about 0.2 µm, is formed on the interlayer insulation film 12 and on the sides and bottom of the opening 42*a*, as shown in FIG. 9B. By this process, the opening 42*a* becomes an opening 43*a* which is constructed to have multiple linear trenches arranged in a lattice pattern, with the width of each linear trench being narrower than the opening 42*a* by double the thickness of the insulation film 45A (i.e. the insulation film 45).

Figure 9C:
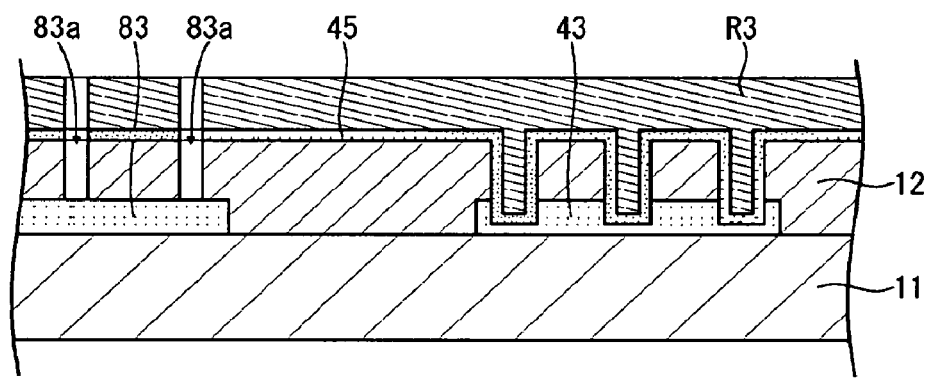

Next, by conducting known photolithographic processes on the insulation film 45A, a resist pattern R3 having openings formed over a region where the first element 80 will be formed is formed on the insulation film 45A, the openings having the same upper shape as contact holes 82a (which will be formed in the post process). Next, by etching the insulation film 45A and the interlayer insulation film 12 while using the resist pattern R3 as a mask, contact holes 82a each having a diameter of about 0.5 μm are formed over the under layer conductive film 83, as shown in FIG. 9C. By this process, the insulation film 45A is processed into an insulation film 45. After forming the contact holes 82a, the resist pattern R3 is removed.

Figure 10A:
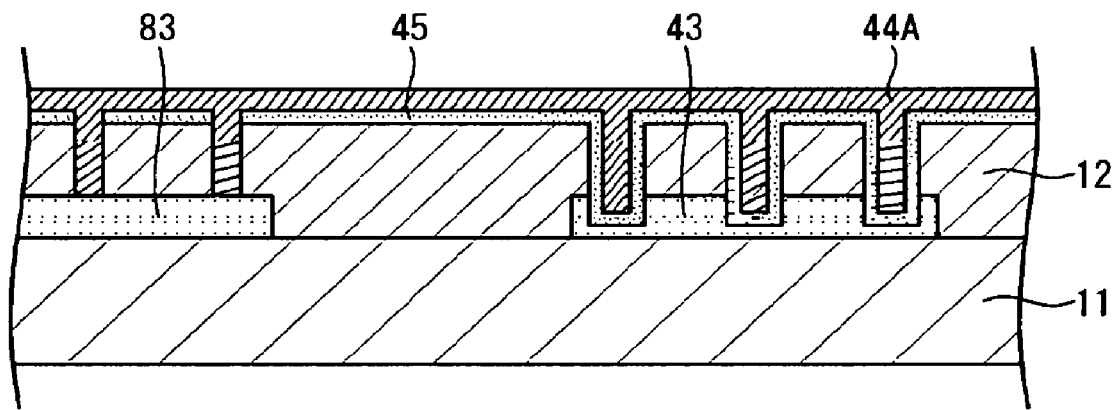

Next, by depositing tungsten (W) over the entire surface of the support substrate 11 using the CVD method or a sputtering method, for instance, a tungsten film 44A is formed on the insulation film 45 and the inside of the opening 43a and the contact holes 83a, as shown in FIG. 10A.

Figure 10B:
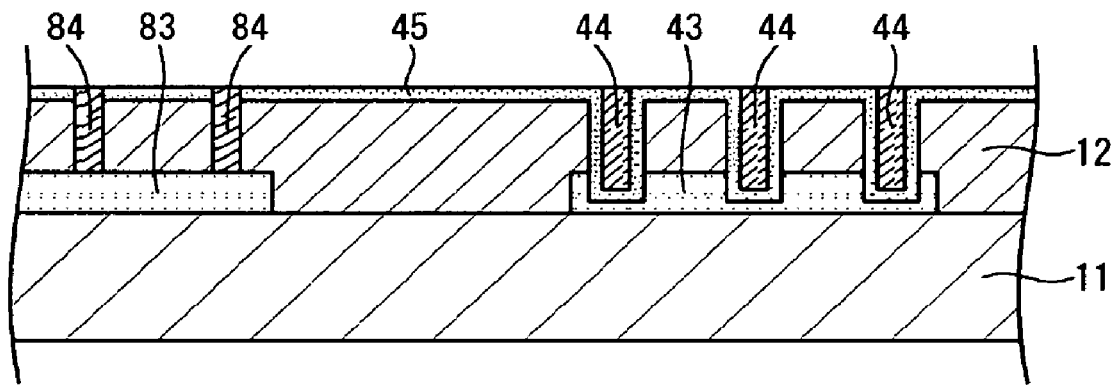

Next, by etching back the tungsten film 44A, the tungsten film 44A over the interlayer insulation film 12 is removed while leaving portions of the tungsten film 44A inside the opening 43a and the contact holes 83a. By these processes, the intra-opening electrode 44 is formed inside the opening 43a, and the contact plugs 84 are formed inside the contact holes 83a, as shown in FIG. 10B.

Next, by using the same process described above with reference to FIG. 5A, a multilayer conductive film having the same structure as the multilayer conductive film 13A is formed on the intra-opening electrode 44, the contact plugs 84, and the insulation film 45. Then, by conducting known photolithographic processes on the multilayer conductive film, the resist pattern having the same upper shape as the upper electrode 16 (which will be formed in a post process) and the upper layer conductive film 86 (which will be formed in a post process) is formed. Then, by etching the multilayer conductive film while using the resist pattern as a mask, the upper electrode 16 and the upper layer conductive film 86 are formed.

By performing the processes described above, the semiconductor device 4 shown in FIG. 8 can be acquired.

As described above, the semiconductor device 4 according to the second embodiment of the present invention has the support substrate (11) which is a semiconductor substrate, the lower electrode (43) formed on the support substrate (11) having the opening (i.e., the lower portion of the opening 42a) formed therein having multiple trenches crossing one another, each having a predetermined width, the insulation film (12) formed on the lower electrode (43) having the opening (i.e. the upper portion of the opening 42a) formed over the lower electrode 43 having multiple trenches crossing one another, each having a predetermined width, the insulation film (45) formed on the side and the bottom of the opening (42a), the intra-opening electrode (44) formed on the insulation film (45) inside the opening (43a), and the upper electrode (16) formed on the insulation film (45) and the intra-opening electrode (44).

With this type of structure, in which the insulation film 45 is formed inside the opening 43a composed of multiple trenches each having a predetermined width, and the intra-opening electrode 44 is formed on this insulation film 45 inside the opening 43a, it is possible to make the width of each linear portion constructing the intra-opening electrode 44 about the same as the width (or diameter) of the contact plugs 84. Therefore, it is possible to prevent any tungsten film from remaining inside the opening 43a in a form of sidewalls at the time of forming the intra-opening electrode 44 and the contact plugs 84. As a result, possible defects in the manufacturing processes and a decrease in the yield ratio can be prevented.

Furthermore, by having the opening 42a extend to the interior of the lower electrode 43, it is possible to enlarge the area between the lower electrode 43 and the intra-opening electrode 44. Therefore, it is possible to obtain a higher capacitive density for the capacitive element 40, and as a result, it is possible to obtain the desired capacitance with a small sized device. This means that it is possible to prevent the semiconductor device 4 from becoming larger in size.

Moreover, by forming the opening 42a to have a structure in which multiple trenches each having a predetermined width cross one another, it is possible to enlarge the area of the opening 42a in terms of a horizontal plane section, while maintaining the width of each trench. Therefore, it is possible to obtain an even higher capacitive density for the capacitive element 40, and as a result, it is possible to obtain a desired capacitance with a small sized device. This means that it is possible to further prevent the semiconductor device 4 from becoming larger in size.

In addition, according to the manufacturing method of the semiconductor device 4 according to the second embodiment of the present invention, since the insulation film 45 functioning as a capacitive insulation film is formed after the opening 42a is formed in the interlayer insulation film 12 and the lower electrode 43, the etching process for forming the opening 42a will be made easier. In a situation in which an insulation film that is a capacitive insulation film is supposed to be formed before forming the opening 42a, at the time of etching the interlayer insulation film 12 and the lower electrode 43, it will be necessary to have a predetermined control for stopping the etching in order to prevent any short circuit from occurring between the intra-opening electrode 44 and the upper electrode 16 which are to be formed in the latter processes. On the other hand, according to the second embodiment of the present invention, the insulation film 45 is supposed to be formed after the opening 42a are formed, and therefore, it is not necessary to have any such particular control for stopping the etching.

Third Embodiment

Next, a third embodiment of the present invention will be described in detail with reference to the drawings. In the following, the same reference numbers will be used for the structural elements that are the same as the first or second embodiments, and redundant explanations of those structure elements will be omitted.

Structure

Figure 11A:
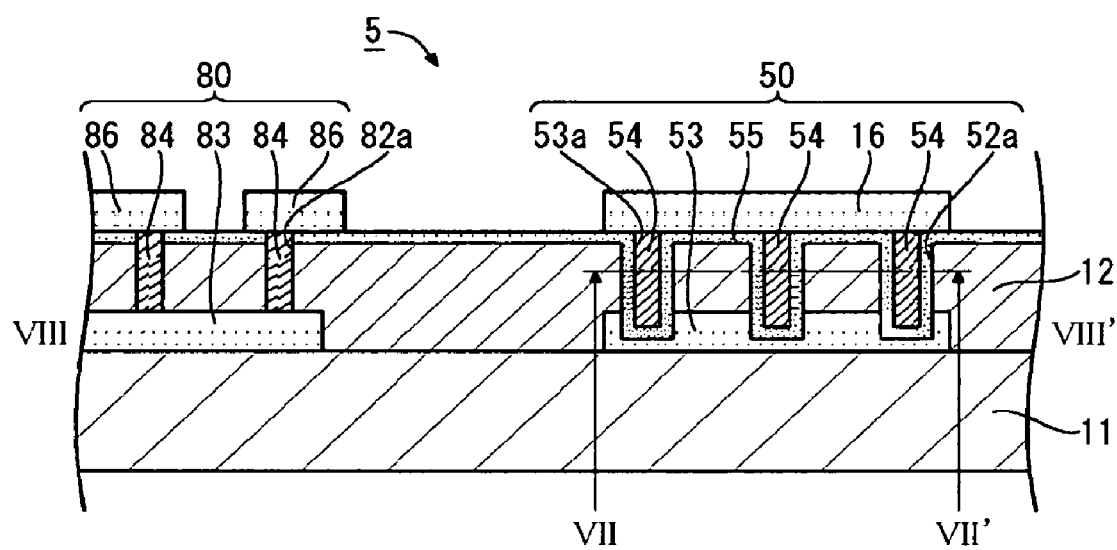
FIG. 11A is a sectional view of a semiconductor device according to a third embodiment of the present invention.
Figure 11B:
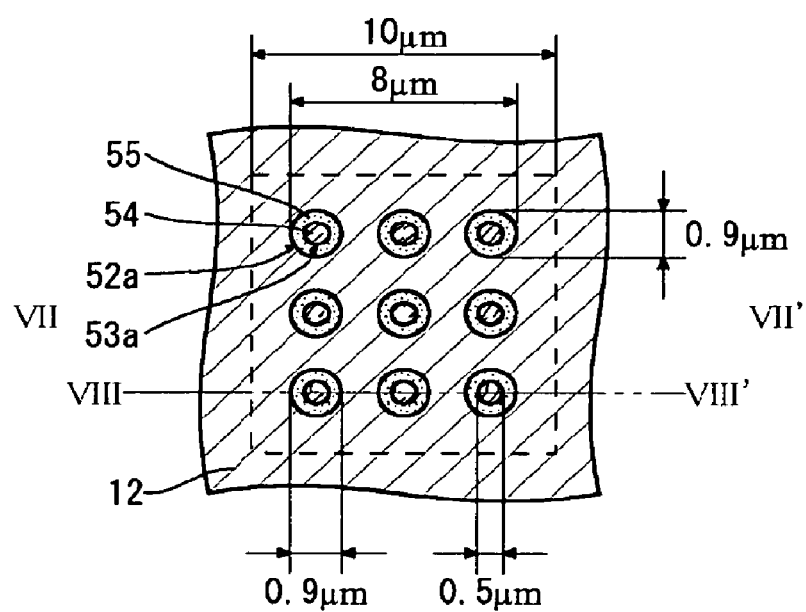
FIG. 11B is a sectional view showing the structure of a horizontal plane section of a capacitive element according to the third embodiment of the present invention taken along line VII-VII' shown in FIG. 11A.

FIG. 11A is a sectional view of a semiconductor device 5 according to the third embodiment of the present invention. FIG. 11A shows a sectional structure of the semiconductor device 5 cut off at a plane which is perpendicular to a support substrate 11, and includes a capacitive element 50 and a second element 80. FIG. 11B is a sectional view showing the structure of a horizontal plane section of the capacitive element 50 taken along line VII-VII' shown in FIG. 11A. That is, FIG. 11B is a sectional view showing a horizontal plane section between a lower electrode 53 and an upper electrode 16 in the capacitive element 50. In addition, FIG. 11A shows the sectional structure of the semiconductor device 5 which includes a plane VIII-VIII' shown in FIG. 11B.

As shown in FIG. 11A and FIG. 11B, the semiconductor device 5 of this embodiment has the same structure as the semiconductor device 4 of the second embodiment, except that the capacitive element 40 constructed with the lower electrode 43, the opening 42a, the opening 43a, the intra-opening electrode 44, and the insulation film 45 is replaced with a capacitive element 50 constructed with a lower electrode 53, an opening 52a, an opening 53a, an intra-opening electrode 54, and an insulation film 55. Since the rest of the structure is the same as the structure of the semiconductor device 4 of the second embodiment, a detailed description thereof will be omitted.

In the above-described structure, as with the second embodiment, the opening 52a extends to the interior the lower electrode 53, but the bottom thereof does not contact with the support substrate 11. That is, a lower portion of the opening 52a is formed in the interior of the lower electrode 53. Therefore, the insulation film 55, the opening 53a, and the intra-opening electrode 54 also extend to the interior of the lower electrode 53.

As shown in FIG. 11B, the openings 52a are columnar trenches each of which having a diameter about 0.9 μm. In other words, the semiconductor device 5 of this embodiment has a structure in which the opening 42a in the semiconductor device 4 of the second embodiment, which is the lattice-shape trench, is replaced with one or more columnar trenches. As with such replacement, the semiconductor device 5 of this embodiment has a structure in which the opening 43a in the second embodiment is replaced with one or more columnar trenches (i.e., the openings 53a), and the intra-opening electrode 44 in the second embodiment is replaced with one or more columnar electrodes (i.e., the intra-opening electrodes 54). In other words, in this embodiment, the intra-opening electrodes 54 fill the interior of the openings 53a, each of which having the same shape as the contact hole 82a. Even if separate intra-opening electrodes 54 are used as portions of the upper electrode extending toward the lower electrode 54 in the capacitive element 50, by having the intra-opening electrodes 54 extending into the interior of the lower electrode 53 as in this embodiment, it is possible to increase the effective area which functions as a capacitive element, and thereby, it is possible to achieve a higher capacitive density of the capacitive element 50. Accordingly, it is possible to obtain a semiconductor device 5 which is capable of obtaining the desired capacitance with a small sized device.

Manufacturing Method

A method of manufacturing the semiconductor device 5 according to the third embodiment of the present invention has the same processes as the method of manufacturing the semiconductor device 4 according to the second embodiment of the present invention, except that the resist pattern R2 is replaced with a resist pattern having an opening which has the same opening shape as the opening 52a. Note that in the following, redundant explanations will be omitted.

As described above, the semiconductor device 5 according to the third embodiment of the present invention has the support substrate (11) which is a semiconductor substrate, the lower electrode (53) formed on the support substrate (11) having the openings (i.e., the lower portion of the openings 52a) formed therein, the insulation film (12) formed on the lower electrode (53) having the openings (i.e., the upper portion of the opening 52a) formed over the lower electrode 53, the insulation film (55) formed on the sides and the bottoms of the openings (52a), the intra-opening electrodes (54) formed on the insulation film (55) inside the openings (52a), and the upper electrode (16) formed on the insulation film (55) and the intra-opening electrodes (54).

With this type of structure, in which the insulation film 55 is formed inside the openings 52a, each of which having the same predetermined diameter as the contact hole 82a, and the intra-opening electrodes 54 are formed on this insulation film 55 inside the openings 52a, it is possible to make the diameter of each intra-opening electrode 54 about the same as the width (or diameter) of the contact plugs 84. Therefore, it is possible to prevent tungsten film from remaining inside the openings 53a in the form of sidewalls at the time of forming the intra-opening electrodes 54 and the contact plugs 84. As a result, possible defects in the manufacturing processes and a decrease in the yield ratio can be prevented.

Furthermore, by having the openings 52a extend to the inside of the lower electrode 53, it is possible to enlarge the area between the lower electrode 53 and the intra-opening electrodes 54. Therefore, it is possible to obtain a higher capacitive density for the capacitive element 50, and as a result, it is possible to obtain a desired capacitance with a small sized device. This means that it is possible to prevent the semiconductor device 5 from becoming larger in size.

In addition, according to the manufacturing method of the semiconductor device 5 according to the third embodiment of the present invention, since the insulation film 55 functioning as a capacitive insulation film is formed after the openings 52a are formed in the interlayer insulation film 12 and in the lower electrode 53, the etching process for forming the openings 52a will be made easier. In a situation in which an insulation film that is a capacitive insulation film is supposed to be formed before forming the openings 52a, at the time of etching the interlayer insulation film 12 and the lower electrode 53, it will be necessary to have a predetermined control for stopping the etching in order to prevent any short circuit from occurring between the intra-opening electrodes 54 and the upper electrode 16 which are to be formed in the latter processes. On the other hand, according to the third embodiment of the present invention, the insulation film 55 is supposed to be formed after the openings 52a are formed, and therefore, it is not necessary to have any such particular control for stopping the etching.

Fourth Embodiment

Next, a fourth embodiment of the present invention will be described in detail with reference to the drawings. In the following, the same reference numbers will be used for the structural elements that are the same as at least one of the first to third embodiments, and redundant explanations of those structure elements will be omitted.

Structure

Figure 12A:
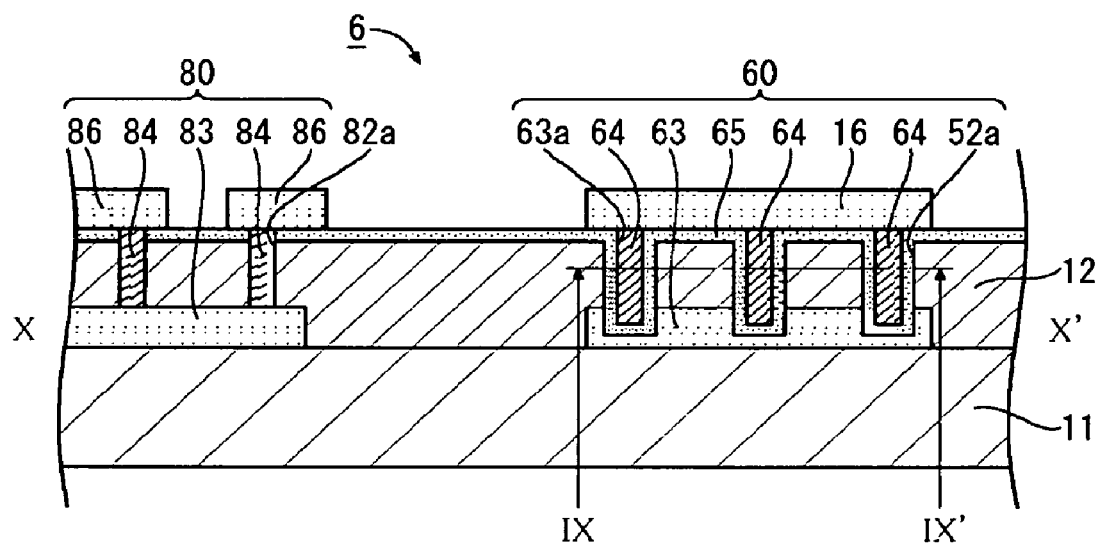
FIG. 12A is a sectional view of a semiconductor device according to a fourth embodiment of the present invention.
Figure 12B:
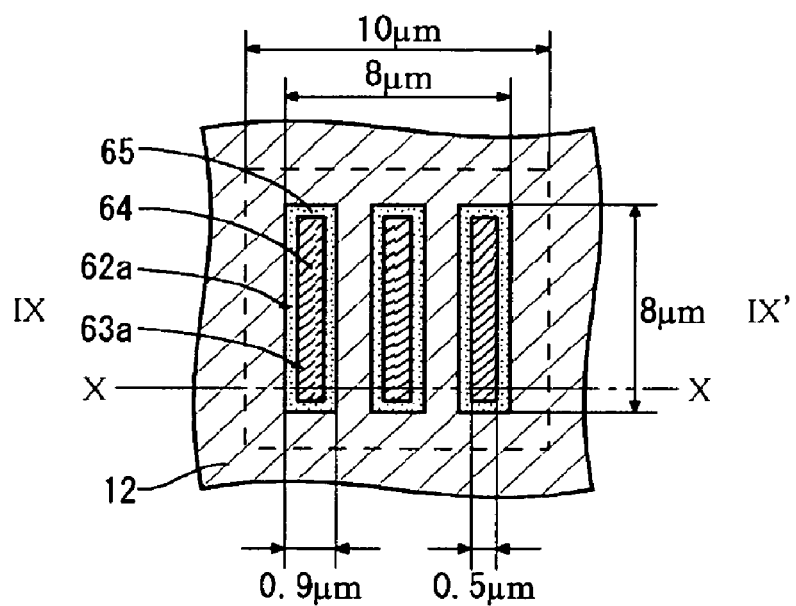
FIG. 12B is a sectional view showing the structure of a horizontal plane section of a capacitive element according to the fourth embodiment of the present invention taken along line IX-IX' shown in FIG. 12A.

FIG. 12A is a sectional view of a semiconductor device 6 according to the fourth embodiment of the present invention. FIG. 12A shows a sectional structure of the semiconductor device 6 cut off at a plane which is perpendicular to a support substrate 11, and includes a capacitive element 60 and a second element 80. FIG. 12B is a sectional view showing the structure of a horizontal plane section of the capacitive element 60 taken along a line IX-IX' shown in FIG. 12A. That is, FIG. 12B is a sectional view showing a horizontal plane section between a lower electrode 63 and an upper electrode 16 in the capacitive element 60. In addition, FIG. 12A shows the sectional structure of the semiconductor device 6 which includes a plane X-X' shown in FIG. 12A.

As shown in FIG. 12A and FIG. 12B, the semiconductor device 6 of this embodiment has the same structure as the semiconductor device 4 of the second embodiment except that the capacitive element 40 constructed with the lower electrode 43, the opening 42a, the opening 43a, the intra-opening electrode 44, and the insulation film 45 is replaced with a capacitive element 60 constructed with a lower electrode 63, an opening 62a, an opening 63a, an intra-opening electrode 64, and an insulation film 65. Since the rest of the structure is the same as the structure of the semiconductor device 4 of the second embodiment, a detailed description thereof will be omitted.

In the above-described structure, as with the case of the second embodiment, the opening 62a extends to the interior of the lower electrode 63 but the bottom thereof does not contact with the support substrate 11. That is, a lower portion of the opening 62a is formed in the interior of the lower electrode 63. Therefore, the insulation film 65, the opening 63a, and the intra-opening electrode 64 also extend to the interior of the lower electrode 63.

As shown in FIG. 12B, the openings 62a are linear trenches, each of which having a width of about 0.9 µm and a length of about 8 µm. In other words, the semiconductor device 6 of this embodiment has a structure in which the opening 42a in the semiconductor device 4 of the second embodiment, which is the lattice-shape trench, is replaced with one or more linear trenches. As with this replacement, the semiconductor device 6 of this embodiment has a structure in which the opening 43a in the second embodiment is replaced with one or more linear trenches (i.e., the openings 63a), and the intra-opening electrode 44 in the second embodiment is replaced with one or more linear electrodes (i.e., the intra-opening electrodes 64). In other words, in this embodiment, the intra-opening electrodes 64 fill the interior of the openings 63a. Even if separate intra-opening electrodes 64 are used as portions of the upper electrode that extend toward the lower electrode 64 in the capacitive element 60, by having the intra-opening electrodes 64 extend to the interior of the lower electrode 63 as in this embodiment, it is possible to increase the effective area which functions as a capacitive element, and thereby, it is possible to achieve a higher capacitive density of the capacitive element 60. Accordingly, it is possible to obtain a semiconductor device 6 which is capable of obtaining the desired capacitance with a small sized device.

Manufacturing Method

A method of manufacturing the semiconductor device 6 according to the fourth embodiment of the present invention has the same processes as the method of manufacturing the semiconductor device 4 according to the second embodiment of the present invention, except that the resist pattern R2 is replaced with a resist pattern having an opening which has the same opening shape as the opening 62a. Note also that in the following, redundant explanations will be omitted.

As described above, the semiconductor device 6 according to the fourth embodiment of the present invention has the support substrate (11) which is a semiconductor substrate, the lower electrode (63) formed on the support substrate (11) having the openings (i.e. the lower portion of the openings 62a) formed therein, the insulation film (12) formed on the lower electrode (63) having the openings (i.e. the upper portion of the opening 62a) formed over the lower electrode 63, the insulation film (65) formed on the sides and the bottoms of the openings (62a), the intra-opening electrodes (64) formed on the insulation film (65) inside the openings (62a), and the upper electrode (16) formed on the insulation film (65) and the intra-opening electrodes (64).

With this type of structure, in which the insulation film 65 is formed inside the openings 62a, each of which having a width that is the same as the contact hole 82a, and the intra-opening electrodes 64 are formed on the insulation film 65 inside the openings 62a, it is possible to make the width of each intra-opening electrode 64 about the same as the width (or diameter) of the contact plugs 84. Therefore, it is possible to prevent tungsten film from remaining inside the openings 63a in form of sidewalls at the time of forming the intra-opening electrodes 64 and the contact plugs 84. As a result, possible defects in the manufacturing processes and a decrease in the yield ratio can be prevented.

Furthermore, by having the openings 62a extend to the interior of the lower electrode 63, it is possible to enlarge the area between the lower electrode 63 and the intra-opening electrodes 64. Therefore, it is possible to obtain a higher capacitive density for the capacitive element 60, and as a result, it is possible to obtain the desired capacitance with a small sized device. This means that it is possible to prevent the semiconductor device 6 from becoming larger in size.

In addition, according to the manufacturing method of the semiconductor device 6 according to the fourth embodiment of the present invention, since the insulation film 65 functioning as a capacitive insulation film is formed after the openings 62a are formed in the interlayer insulation film 12 and the lower electrode 63, the etching process for forming the openings 62a will be made easier. In a situation in which an insulation film that is a capacitive insulation film is supposed to be formed before forming the openings 62a, at the time of etching the interlayer insulation film 12 and the lower electrode 63, it will be necessary to have a predetermined control for stopping the etching in order to prevent any short circuit from occurring between the intra-opening electrodes 64 and the upper electrode 16 which are to be formed in the latter processes. On the other hand, according to the fourth embodiment of the present invention, the insulation film 65 is supposed to be formed after the openings 62a are formed, and therefore, it is not necessary to have any such particular control for stopping the etching.

While the preferred embodiments of the invention have been described using specific terms, such description is for illustrative purpose only, and it is to be understood that changes and variations may be made without departing from the spirit of the scope of the following claims.

In the first to fourth embodiments described above, although a situation is described as an example in which the lower electrode of a capacitive element is formed on a support substrate, the present invention is not limited to this situation. For instance, the present invention can be applied to a structure in which the lower electrode of a capacitive element is formed on an insulation film (e.g. an interlayer insulation film) formed over a support substrate.

Furthermore, in the first to fourth embodiments described above, although the width (or the diameter) of each of the trenches constructing the opening (13a, 23a, 33a, 43a, 53a or 63a) is about the same as the diameter of the contact holes 82a, the present invention is not limited to this factor. For instance, at the time of forming the contact plug 84 and the intra-opening electrode (14, 24, 34, 44, 54 or 64), as long as each trench of the opening (13a, 23a, 33a, 43a, 53a or 63a) has an appropriate width which will not allow the conductor such as tungsten (W) that fills the interior of the opening to remain unnecessarily in a form of sidewalls, i.e., as long as each trench of the opening has an appropriate width which will allow only an appropriate amount of conductor to remain inside the opening to seal the opening at the bottom, the trenches of the opening may be changed in various ways.

This application claims priority to Japanese Patent Application No. 2005-157180. The entire disclosures of Japanese Patent Application No. 2005-157180 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

The invention claimed is:

1. A semiconductor device comprising:
   a substrate;
   a first conductive film formed over the substrate and having a first opening therein, the first opening having a predetermined width;
   a first insulation film formed over the first conductive film and having a second opening over the first opening, the second opening being aligned with the first opening and having a width that is substantially the same as the width of the first opening;
   a second insulation film formed on the sides of the first and second openings;
   a second conductive film formed on the second insulation film inside the first and second openings; and
   a third conductive film formed on the second insulation film and the second conductive film.

2. The semiconductor device according to claim 1, wherein the second opening is a cylindrical pit.

3. The semiconductor device according to claim 1, wherein the second opening is a trench having a predetermined width.

4. The semiconductor device according to claim 1, wherein the second opening is formed to have multiple crossing trenches each having a predetermined width.

5. The semiconductor device according to claim 1, wherein the first opening is not in contact with the substrate.

6. The semiconductor device according to claim 1, wherein the depth of the first opening is deeper than the thickness of the second insulation film.

7. The semiconductor device according to claim 1, wherein the first conductive film is a multiple-layer film having one or more titanium nitride layers, one or more titanium layers, and one or more aluminum silicon layers.

8. The semiconductor device according to claim 1, wherein the first conductive film has a titanium nitride layer on the lowest layer and a titanium layer formed on the titanium nitride layer; and
   the bottom of the first opening lies between the upper surface and the lower surface of the titanium layer.

9. The semiconductor device according to claim 1, wherein the first insulation film has a contact hole formed therein, the contact hole being formed in the first insulation film so as to not be over the first conductive film, and
   the predetermined width is wider than the diameter of the contact hole by more than double the thickness of the second insulation film.

10. The semiconductor device according to claim 1, wherein a main component of the second conductive film is tungsten.

* * * * *